US009430597B2

(12) United States Patent
Belledent (10) Patent No.: US 9,430,597 B2
(45) Date of Patent: Aug. 30, 2016

(54) METHOD FOR ESTIMATING PATTERNS TO BE PRINTED ON A PLATE OR MASK BY MEANS OF ELECTRON-BEAM LITHOGRAPHY AND CORRESPONDING PRINTING DEVICE

(71) Applicants: COMMISSARIAT A L'ENERGIE ATOMIQUE ET AUX ENE ALT, Paris (FR); ASELTA NANOGRAPHICS, Grenoble (FR)

(72) Inventor: Jerome Belledent, Meylan (FR)

(73) Assignees: Commissariat à l'énergie atomique et aux énergies alternatives, Paris (FR); ASELTA NANOGRAPHICS, Grenoble (FR)

( * ) Notice: Subject to any disclaimer, the term of this patent is extended or adjusted under 35 U.S.C. 154(b) by 340 days.

(21) Appl. No.: 14/100,484

(22) Filed: Dec. 9, 2013

(65) Prior Publication Data

US 2014/0180462 A1    Jun. 26, 2014

(30) Foreign Application Priority Data

Dec. 21, 2012  (FR) ...................................... 12 62521

(51) Int. Cl.
*G06F 19/00* (2011.01)
*G06F 17/50* (2006.01)
(Continued)

(52) U.S. Cl.
CPC ............. *G06F 17/5045* (2013.01); *G03F 1/82* (2013.01); *G03F 7/2061* (2013.01);
(Continued)

(58) Field of Classification Search
CPC .... G06F 17/5045; G03F 1/82; G03F 7/2061; G03F 7/70441; G03F 7/70491
USPC ............... 700/97, 105, 121, 125; 716/50, 55
See application file for complete search history.

(56) References Cited

U.S. PATENT DOCUMENTS 5,847,959 A * 12/1998 Veneklasen ............ B82Y 10/00
250/492.2

(Continued)

FOREIGN PATENT DOCUMENTS

DE           198 40 833 A1    3/2000
DE    10 2010 035 047 A1    2/2012

OTHER PUBLICATIONS

French Preliminary Search Report issued Sep. 23, 2013, in French Application No. 12 62521 filed Dec. 21, 2012 (with Written Opinion and English Translation of Categories of Cited Documents).

(Continued)

*Primary Examiner* — Ronald Hartman, Jr.
(74) *Attorney, Agent, or Firm* — Oblon, McClelland, Maier & Neustadt, L.L.P (57) ABSTRACT

This method for estimating patterns ($M'_{PF}, D'_{PF}$) to be printed by means of electron-beam lithography, comprises the following steps: printing (100), in a resin, a set of calibration patterns ($M_{CF}, D_{CF}$); measuring (120) characteristic dimensions (CD) of this set; supplying an estimation (140) of the point spread function (PSF) based on the characteristic dimensions (CD) measured; estimating (160) the patterns ($M'_{PF}, D'_{PF}$) to be printed by convoluting the point spread function (PSF) supplied with an initial value of the patterns ($M_{PF}, D_{PF}$).

Furthermore, each calibration pattern printed includes a central zone exposed to the electron beam and a plurality of surrounding concentric zones with rotational symmetry. The characteristic dimensions measured are characteristic dimensions (CD) of the central zones of the patterns. The estimation of the point spread function (PSF) is calculated by inverting analytical modelling of the effect, on these characteristic dimensions, of applying the first point spread function portion ($PSF_{BE}$) characterising electrons back-scattered by the substrate to the set of calibration patterns ($M_{CF}, D_{CF}$).

10 Claims, 3 Drawing Sheets (51) Int. Cl.
*G03F 7/20* (2006.01)
*H01J 37/317* (2006.01)
*G03F 1/82* (2012.01)

(52) U.S. Cl.
CPC ...... *G03F 7/70441* (2013.01); *G03F 7/70491* (2013.01); *H01J 37/3174* (2013.01); *H01J 2237/31754* (2013.01); *H01J 2237/31769* (2013.01)

(56) References Cited

U.S. PATENT DOCUMENTS

| | | | | |
|---|---|---|---|---|
| 7,266,800 | B2* | 9/2007 | Sezginer | G03F 7/70425 716/52 |
| 7,501,212 | B2* | 3/2009 | Lai | G03F 1/144 430/5 |
| 7,856,612 | B1* | 12/2010 | Ungar | G03F 1/50 378/35 |
| 9,002,497 | B2* | 4/2015 | Volk | G01N 21/9501 438/14 |
| 2005/0224725 | A1* | 10/2005 | Menon | G03F 1/78 250/492.22 |
| 2005/0273753 | A1* | 12/2005 | Sezginer | G03F 7/70425 716/52 |
| 2006/0150131 | A1* | 7/2006 | Lai | G03F 1/144 716/52 |
| 2008/0067446 | A1* | 3/2008 | Belic | B82Y 10/00 250/492.22 |
| 2009/0027650 | A1* | 1/2009 | Yamazoe | G03F 1/36 355/77 |
| 2010/0082313 | A1* | 4/2010 | Tejnil | G03F 7/705 703/12 |
| 2011/0004856 | A1* | 1/2011 | Granik | G03F 1/144 716/55 |
| 2011/0320987 | A1* | 12/2011 | Hoshino | B82Y 10/00 716/53 |
| 2012/0042291 | A1* | 2/2012 | Granik | G03F 1/144 716/55 |
| 2012/0314198 | A1* | 12/2012 | Lee | H01J 37/3174 355/77 |
| 2013/0147925 | A1* | 6/2013 | Lew | G01S 11/12 348/49 |
| 2014/0172386 | A1* | 6/2014 | Belledent | G03F 7/70558 703/2 |

OTHER PUBLICATIONS

Katja Keil, et al., "Fast backscattering parameter determination in e-beam lithography with a modified doughnut test", Microelectronic Engineering, vol. 86, No. 12, Dec. 1, 2009, 4 pages.

L. Stevens, et al., "Determination of the Proximity Parameters in Electron Beam Lithography Using Doughnut-Structures", Microelectronic Engineering Netherlands, vol. 5, No. 1-4, Dec. 1986, 10 pages.

* cited by examiner

METHOD FOR ESTIMATING PATTERNS TO BE PRINTED ON A PLATE OR MASK BY MEANS OF ELECTRON-BEAM LITHOGRAPHY AND CORRESPONDING PRINTING DEVICE

The present invention relates to a method for estimating patterns to be printed on a plate or mask by means of electron-beam lithography. It also relates to a printing device using this method.

The invention applies more specifically to such a method comprising the following steps:
- printing by means of electron-beam lithography, in a resin arranged on a substrate, a set of calibration patterns,
- measuring characteristic dimensions of the set of calibration patterns after printing, and saving these characteristic dimensions to memory,
- supplying, by means of a processor having access to the memory, an estimation of the point spread function characterising electrons scattered during printing, based on the characteristic dimensions measured,
- estimating the patterns to be printed by convoluting the point spread function supplied with an initial value of these patterns to be printed.

Electron-beam lithography requires a phase for preparing a pattern to be printed in view of the proximity effects induced by the scatter of electrons, other chemical species in the resin, or further effects liable to distort the pattern to be printed and which need to be offset. In particular, exposure of the substrate to the electron beam generates scattered electrons, including electrons scattered in the resin and electrons back-scattered by the substrate, producing the so-called "proximity effect". This effect induces a broadening of the final pattern printed on the resin in relation to the pattern initially sought. The effect is particularly problematic as the patterns to be applied become finer and are situated in an area where the density of patterns to be printed is greater.

As a general rule, to be able to offset this effect, one known method consists of modelling the point spread function (PSF), also known as the percussion response, including the PSF of the electrons back-scattered by the substrate, referred to as $PSF_{BE}$ (from "Back-scattered Electrons Point Spread Function") and the PSF of the electrons scattered in the resin, also known to those skilled in the art as $PSF_{FE}$ (from "Forward-scattered Electrons Point Spread Function"). This function, $PSF=PSF_{BE}+PSF_{FE}$, is then used to calculate, during a so-called estimation simulation step, the final dose to be applied locally on the resin to print the pattern. This final dose is estimated by convoluting the PSF function obtained with an initial value of the pattern to be printed. The dose obtained accounts for the parasitic dose induced by the proximity effect on the pattern.

A first solution consists more specifically of modelling the shape of the PSF with a sum of Gaussian functions. In order to determine the coefficients characterising these Gaussian functions, various calibration patterns, for example lines, are printed on the resin by applying various electric charge doses with the electron beam. Characteristic dimension measurements are made on the calibration patterns printed and used to determine the parameters of the Gaussian function by simulation using a dedicated computer program well-known to those skilled in the art as a "solver".

Nonetheless, the doses calculated are imprecise and prevent printing of the pattern with satisfactory precision since, in fact, the shape of $PSF_{BE}$ is not truly Gaussian. Indeed, it is dependent on the distribution of the number of back-scattered electrons and the distribution of the energy thereof which do not observe a Gaussian distribution.

It may thus be sought to provide a method for estimating patterns to be printed of the aforementioned type which makes it possible to do away with at least some of the aforementioned problems and constraints, particularly which makes it possible to not require a particular shape for the $PSF_{BE}$ of the electrons back-scattered during printing and to do away with the use of a solver for calculating this $PSF_{BE}$.

The invention thus relates to a method for estimating patterns to be printed on a plate or mask by means of electron-beam lithography, comprising the following steps:
- printing by means of electron-beam lithography, in a resin arranged on a substrate, a set of calibration patterns,
- measuring characteristic dimensions of the set of calibration patterns after printing, and saving these characteristic dimensions to memory,
- supplying, by means of a processor having access to the memory, an estimation of the point spread function characterising electrons scattered during printing, based on the characteristic dimensions measured,
- estimating the patterns to be printed by convoluting the point spread function supplied with an initial value of these patterns to be printed, wherein:
- each calibration pattern printed in the resin includes a central zone exposed to the electron beam and a plurality of concentric zones with rotational symmetry arranged about this central zone,
- the characteristic dimensions measured after printing are characteristic dimensions of the central zones of the patterns, and
- the estimation of the point spread function is calculated as the sum of a first point spread function portion characterising electrons back-scattered by the substrate and a second point spread function portion characterising electrons scattered in the resin, and comprises an inversion of analytical modelling of the effect, on said characteristic dimensions, of applying the first point spread function portion to the set of calibration patterns.

By means of the invention, the calculation of the PSF of the electrons scattered in the resin and back-scattered by the substrate does not make an assumption on the shape of the portion $PSF_{BE}$ (other than the rotational symmetry thereof) and the doses calculated in this way during the step for estimating the patterns to be printed are sufficiently precise to succeed in printing the patterns sought with enhanced precision and having offset the proximity effects. Besides the precision of the result, the calculation of the $PSF_{BE}$ is also accelerated, since it results directly from the measurements of the characteristic dimensions of the calibration patterns such that no digital simulation program (solver) is required.

Optionally, the application of the first point spread function portion to the set of calibration patterns is modelled analytically by the product of a matrix modelling the set of calibration patterns with a vector modelling the first point spread function portion, the analytical modelling being inverted by inverting the matrix modelling the set of calibration patterns.

Also optionally, the matrix modelling the set of calibration patterns is a square matrix of order n that models a set of n patterns with n concentric zones, each row of the matrix corresponding to one of the calibration patterns and each column of the matrix corresponding to one of these concentric zones.

Also optionally, the matrix modelling the set of calibration patterns is expressed using a Hadamard matrix.

Also optionally, the first point spread function portion characterising the electrons back-scattered by the substrate, annotated $PSF_{BE}$, is defined by the following expression:

$$PSF_{BE} \propto \left( \frac{2}{n} H - \begin{bmatrix} 1 & 0 & \ldots & 0 \\ 0 & 0 & \ldots & 0 \\ \vdots & \vdots & & \vdots \\ 0 & 0 & \ldots & 0 \end{bmatrix} \right) \left( \begin{bmatrix} \frac{CD[1]}{S[1]} \\ \vdots \\ \frac{CD[n]}{S[n]} \end{bmatrix} - cd_0 \begin{bmatrix} 1 \\ \vdots \\ 1 \end{bmatrix} \right),$$

where the symbol "∝" denotes a proportional relationship, H is the Hadamard matrix based on which the set of calibration patterns is modelled, $$\begin{bmatrix} \frac{CD[1]}{S[1]} \\ \vdots \\ \frac{CD[n]}{S[n]} \end{bmatrix}$$

is a vector including the set $\{CD[1], \ldots, CD[n]\}$ of the characteristic dimensions measured, weighted by the set $\{S[1], \ldots S[n]\}$ of the respective areas of the concentric zones with rotational symmetry, and $cd_0$ is a characteristic constant of a common dimension of the central zone of each calibration pattern when this central zone is exposed in isolation to the electron beam in the absence of concentric zones with rotational symmetry about this central zone.

Also optionally, the second point spread function portion is modelled using a Gaussian function, the parameters of this Gaussian function being determined by simulation on a plurality of calibration patterns.

Also optionally, the concentric zones with rotational symmetry of the calibration patterns all have the same area.

Also optionally, the first point spread function portion characterising the electrons back-scattered by the substrate is defined by the following expression:

$$PSF_{BE} \propto \left( \frac{2}{n} H - \begin{bmatrix} 1 & 0 & \ldots & 0 \\ 0 & 0 & \ldots & 0 \\ \vdots & \vdots & & \vdots \\ 0 & 0 & \ldots & 0 \end{bmatrix} \right) \left( \begin{bmatrix} CD[1] \\ \vdots \\ CD[n] \end{bmatrix} - cd_0 \begin{bmatrix} 1 \\ \vdots \\ 1 \end{bmatrix} \right).$$

Also optionally, the central zone of each calibration pattern includes one of the concentric zones with rotational symmetry, positioned at the centre of said pattern.

The invention also relates to a device for printing patterns on a plate or mask by means of electron-beam lithography, comprising:
  means for printing by means of electron-beam lithography, in a resin arranged on a substrate, a set of calibration patterns,
  means for measuring characteristic dimensions of the set of calibration patterns after printing and means for storing these characteristic dimensions in memory,
  a processor having access to the memory and programmed to supply an estimation of the point spread function characterising electrons scattered during printing, based on the characteristic dimensions measured,
  means for estimating the patterns to be printed by convoluting the point spread function supplied with an initial value of these patterns to be printed,
wherein, each calibration pattern to be printed in the resin comprising a central zone exposed to the electron beam and a plurality of concentric zones with rotational symmetry arranged about this central zone:
  the measuring means are means for measuring the characteristic dimensions of the central zones of the patterns after printing, and
  the processor is programmed to calculate the estimation of the point spread function as the sum of a first point spread function portion characterising electrons back-scattered by the substrate and a second point spread function portion characterising electrons scattered in the resin, and by inverting analytical modelling of the effect, on said characteristic dimensions, of applying the first point spread function portion to the set of calibration patterns.

The invention will be understood more clearly using the following description, given merely as an example with reference to the appended figures wherein.

Figure 1:
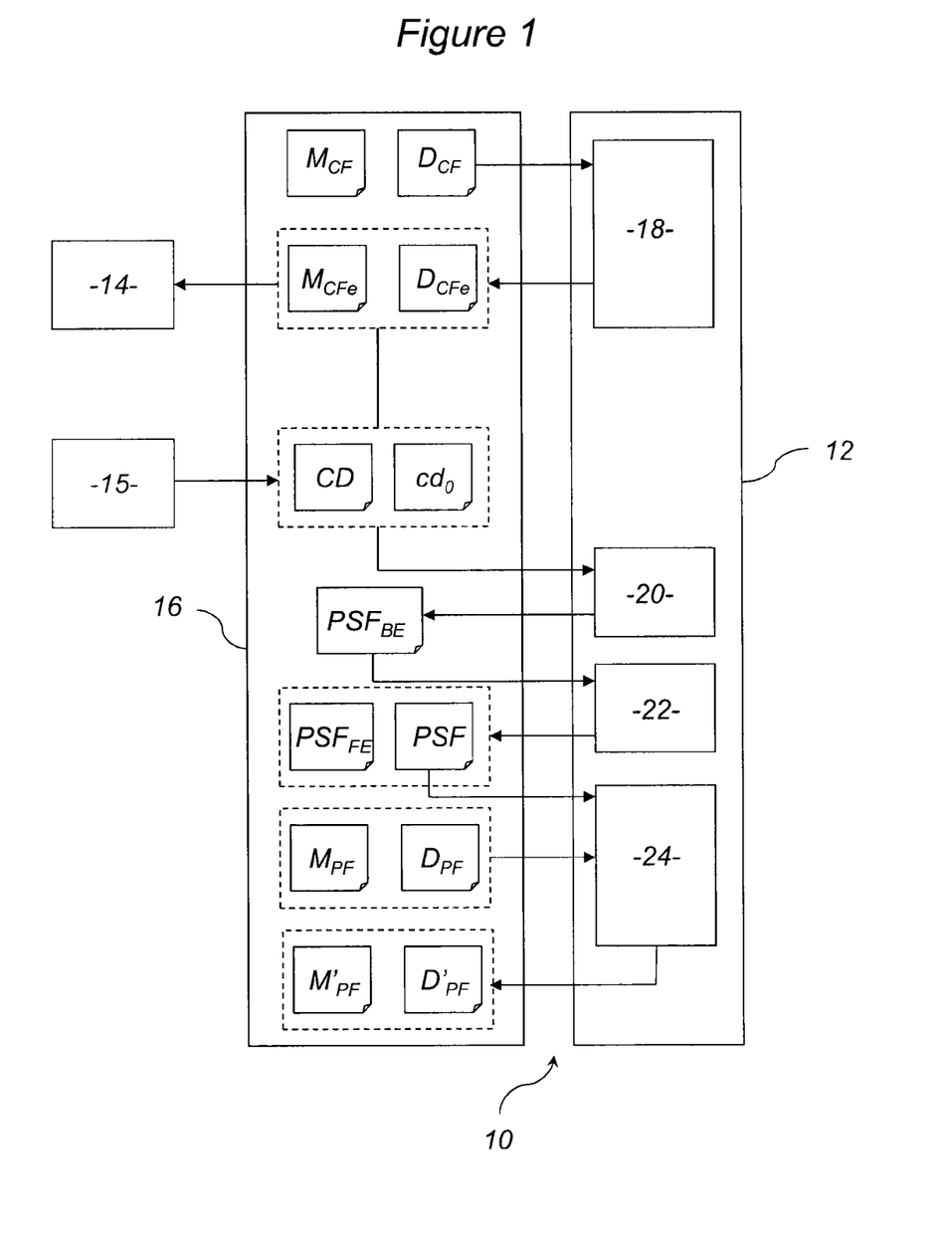
FIG. 1 schematically represents the general structure of a printing device, according to one embodiment of the invention.

The printing device 10 represented schematically in FIG. 1 comprises a processing module 12, a module 14 for printing patterns on a plate or mask by means of electron-beam lithography and a module 15 for measuring characteristic dimensions of patterns printed by the module 14, all three conventionally associated with a memory 16 (for example RAM). The processing module 12 may for example be implemented in a computing device such as a conventional computer comprising a processor associated with one or a plurality of memories for storing data files and computer programs. The processing module 12 may then in turn be considered to consist of a processor associated with a memory for storing instructions executed in the form of computer programs.

The processing module 12 as illustrated in FIG. 1 thus functionally comprises four computer programs 18, 20, 22 and 24.

The first computer program 18 is a program for the prior preparation of a set of calibration patterns $M_C$ to be printed by means of electron-beam lithography for which the parameters are stored in memory 16. The set of calibration patterns $M_C$ is for example more specifically modelled by a set of geometric shapes $M_{CF}$ assigned to a set of predetermined doses $D_{CF}$. The term "dose" denotes an electric charge dose to be applied with the electron beam during the individual printing of the geometric shape associated therewith.

Based on the set $M_{CF}$ of geometric shapes and the set $D_{CF}$ of predetermined doses saved in memory 16, these parameters theoretically defining the set of calibration patterns $M_C$ to be printed, the first program 18 is designed to provide a set of basic geometric shapes $M_{CFe}$ modelling the calibration patterns $M_C$ and an associated set of doses $D_{CFe}$ chosen from a set of discrete values, for example discrete values of the set $D_{CF}$ if said set has discrete values. These sets $M_{CFe}$ and $D_{CFe}$ are for example stored in memory 16.

A first, well-known, solution consists more specifically of modelling the set of calibration patterns $M_C$ with a set of juxtaposed basic geometric shapes $M_{CFe}$ and of assigning each basic shape a dose and an exposure time which are both independent from other basic shapes' doses and exposure times. However, as, in practice, doses need to be chosen from a discrete and limited set $D_{CF}$ of predetermined doses, it is then frequently necessary to multiply the basic geometric shapes and envisage some very small-sized shapes to offset the discretisation of the doses and obtain satisfactory printing precision.

A further solution is for example described in the article by C. Pierrat et al, entitled "Mask data correction methodology in the context of model-base fracturing and advanced mask models", published in Proceedings SPIE of Optical Microlithography No. 24, vol. 7973, 1-3 March 2011, San Jose (Calif.), US. This solution allows the overlay of basic geometric shapes such that it is possible to reduce the number thereof and limit small geometric shapes very substantially. However, overlaying renders the other parameters, notably the electric charge doses and exposure times, mutually dependent.

A third, more effective and novel solution consists of defining the basic geometric shapes $M_{CFe}$ in the form of juxtaposed identical pixels in a matrix, thus forming a regular two-dimensional block covering the set of calibration patterns $M_C$, discretisation error correction then being possible by dithering on these pixels when determining the doses $D_{CFe}$ to be applied to the basic geometric shapes.

The printing module 14 as illustrated in FIG. 1 is suitable for printing, by exposing a resin arranged on a substrate to the electron beam, the set of calibration patterns $M_C$ based on the set $M_{CFe}$ of basic geometric shapes and the associated set $D_{CFe}$ of doses.

The measuring module 15 as illustrated in FIG. 1 is then suitable for measuring the characteristic dimensions CD of the set of calibration patterns $M_C$ after printing by the module 14. As detailed subsequently with reference to FIG. 2, each calibration pattern printed in the resin includes a central zone exposed to the electron beam and a plurality of concentric zones with rotational symmetry arranged about this central zone. The characteristic dimensions CD measured after printing then correspond to the dimensions of the central zones of the patterns. By way of example, when the central zone of a pattern is a disk, the characteristic dimension of this pattern is the dimension of the diameter of this disk. The characteristic dimensions CD of the set of calibration patterns $M_C$ are for example saved in memory 16.

The second computer program 20 of the processing module 12 is a calculator of the point spread function characterising back-scattered electrons $PSF_{BE}$, the operation whereof will be described in detail with reference to FIG. 3. Based on the characteristic dimensions CD measured and saved in memory, this computer program 20 provides an estimation of the point spread function $PSF_{BE}$ characterising the electrons back-scattered by the substrate during printing.

This estimation of the function $PSF_{BE}$ is calculated based on analytical modelling of the effect, on the characteristic dimensions CD, of applying the function $PSF_{BE}$ to the set of calibration patterns $M_C$.

More specifically, the effect, on the characteristic dimensions CD, of applying the function $PSF_{BE}$ to the set of calibration patterns $M_C$ is modelled analytically by the product of a matrix M modelling the set of calibration patterns $M_C$ and a vector modelling the function $PSF_{BE}$. By way of example, the $i^{th}$ component of this vector corresponds to the quantity of electrons back-scattered by the $i^{th}$ concentric zone. By extension, this vector shall also be annotated as $PSF_{BE}$, and the aforementioned effect is defined according to the following expression:

$$CD-cd_0 \propto M*PSF_{BE},$$

where the symbol "$\propto$" denotes a proportional relationship and $cd_0$ is a characteristic constant of a common dimension of the central zone of each calibration pattern when this central zone is exposed in isolation to the electron beam in the absence of concentric zones with rotational symmetry about this central zone. This constant $cd_0$ may be predetermined and stored in memory 16.

It can thus be noted that the effect of the function $PSF_{BE}$ on the set of calibration patterns $M_C$ is proportional to the expansion of the characteristic dimensions CD of the central zones of the printed pattern, this expansion being caused by the proximity effect due to the presence of the surrounding concentric zones.

Inverting this analytical modelling, performed by inverting the matrix M modelling the set of calibration patterns $M_C$, is thus suitable for obtaining an estimation of the function $PSF_{BE}$ according to the following expression:

$$PSF_{BE} \propto M^{-1}*(CD-cd_0).$$

It is noted that this inversion requires the matrix M modelling the set of calibration patterns to be an invertible square matrix, which also applies some constraints to this set of calibration patterns $M_C$.

The function $PSF_{BE}$ obtained is for example stored in memory 16.

The third computer program 22 of the processing module 12 is a program for estimating the point spread function PSF characterising electrons scattered during printing. This function is estimated as the sum of said first point spread function portion $PSF_{BE}$ characterising electrons back-scattered by the substrate and a second point spread function portion $PSF_{FE}$ characterising electrons scattered in the resin. Unlike the function $PSF_{BE}$, the behaviour of the function $PSF_{FE}$ can be modelled using a Gaussian function. For this reason, the second portion $PSF_{FE}$ can be considered to be a Gaussian function, the parameters of this Gaussian function being determined by simulation on a plurality of calibration patterns and using dedicated software. This method well-known to those skilled in the art is thus suitable for obtaining a sufficiently precise estimation of the function $PSF_{FE}$. The functions calculated in this way, $PSF_{FE}$ and $PSF=PSF_{BE}+PSF_{FE}$, are for example stored in memory 16.

The fourth computer program 24 of the processing module 12 is a program for estimating patterns to be printed by the printing device 10, by convoluting the point spread function PSF, supplied by the computer program 22, with an initial value of these patterns to be printed. A pattern to be printed includes for example a set of geometric shapes to be printed, having the initial value $M_{PF}$, associated with a set of predefined doses, having an initial value $D_{PF}$, to be applied with the electron beam when printing said pattern. The result of this convolution gives a final value ($M'_{PF}$, $D'_{PF}$) of the pattern to be printed whereon the effects of parasitic doses induced by the proximity effect have been offset.

The pattern to be printed ($M'_{PF}$, $D'_{PF}$) thus calculated is then used when modelling the pattern into basic geometric shapes $M_{PFe}$ based on the set of geometric shapes to be printed $M'_P$ and more specifically when calculating, by a program similar to the prior preparation program 18 or by the same program, the set of doses $D_{PFe}$ associated with said basic geometric shapes $M_{PFe}$. Finally, the pattern ($M'_{PF}$, $D'_{PF}$) is printed on the resin by the printing module 14 based on the set $M_{PFe}$ of basic geometric shapes and the associated set of doses $D_{PFe}$ with enhanced precision and having offset the proximity effects.

Moreover, it should be noted that the computer programs 18, 20, 22 and 24 are presented as separate entities, but this distinction is merely functional. They may equally well be grouped into one or a plurality of software programs. The functions thereof may also be at least partly micro-programmed or micro-wired in dedicated integrated circuits. In this way, alternatively, the computing device using the processing module 12 may be replaced by an electronic device consisting merely of digital circuits (with no computer program) for performing the same actions.

Figure 2:
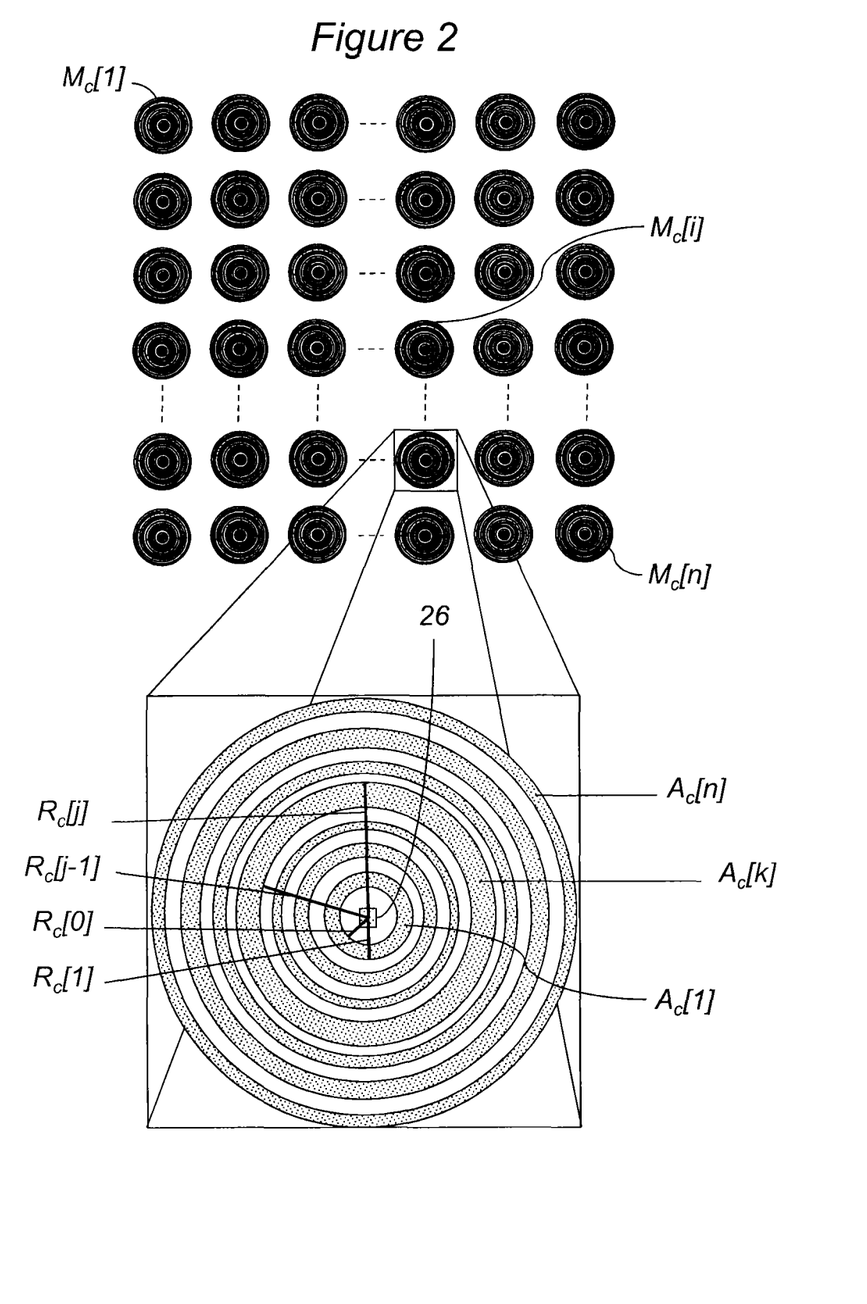
FIG. 2 illustrates a set of calibration patterns used for estimating the point spread function characterising electrons scattered during the printing of a pattern by the printing device in FIG. 1.

FIG. 2 illustrates an example of a set of calibration patterns $M_C$ compatible with invertible matrix modelling according to the invention. Each calibration pattern $M_C[i]$ of the set of n calibration patterns $M_C=\{M_C[i], 0<i\leq n\}$ to be printed in the resin includes a central zone 26 exposed to the electron beam and a set $A_C$ of n concentric zones $A_C=\{A_C[k], 0\leq k\leq n\}$ with rotational symmetry, arranged about this central zone 26. In this example of an embodiment, the concentric zones $A_C$ with rotational symmetry are arranged in order of increasing radii $R_C=\{R_C[j], 0\leq j\leq n\}$ and all have the same area S.

This set of calibration patterns $M_C$ may be modelled by a square matrix M expressed using a Hadamard matrix, H, of order n. Each row of the Hadamard matrix H corresponds to one of the n calibration patterns $M_C[i]$, each calibration pattern including n concentric zones $A_C$. Each column of the Hadamard matrix H represents the exposure to the electron beam of one of these concentric zones $A_C[k]$ for all the calibration patterns $M_C[1], \ldots, M_C[n]$. In this way, the first column of the matrix H corresponds to the concentric zones $A_C[1]$ closest to each central zone 26 of the calibration patterns $M_C$ and the last column of the matrix H corresponds to the concentric zones $A_C[n]$ furthest from each central zone 26 of the calibration patterns $M_C$. The exposure of the $i^{th}$ calibration pattern $M_C[i]$ to the electron beam is thus represented by the $i^{th}$ row of the matrix H. The set of values of the coefficients of the Hadamard matrix H being limited to two discrete values, 1 or −1, only the concentric zones $A_C$ with rotational symmetry corresponding to the coefficients having the value 1 of the Hadamard matrix H are exposed to the electron beam.

It should be noted that using a square matrix as a matrix M modelling the set of calibration patterns $M_C$ infers that the total number n of concentric zones $A_C$ with rotational symmetry in any one of the calibration patterns $M_C[i]$ is strictly equal to the total number n of calibration patterns $M_C[1], \ldots, M_C[n]$ printed in the resin.

Moreover, using the Hadamard matrix H for expressing the matrix M modelling the set $M_C$ of calibration patterns ensures that half n/2 of the concentric zones $A_C$ with rotational symmetry belonging to each of the patterns $M_C[i]$ are exposed to the electron beam, this being true for all the calibration patterns printed in the resin apart from the first pattern $M_C[1]$. Indeed, the values of the coefficients of the first row of the Hadamard matrix H all being equal to 1, all the concentric zones $A_C$ with rotational symmetry of this calibration pattern $M_C[1]$ are consequently exposed to the beam.

Figure 3:
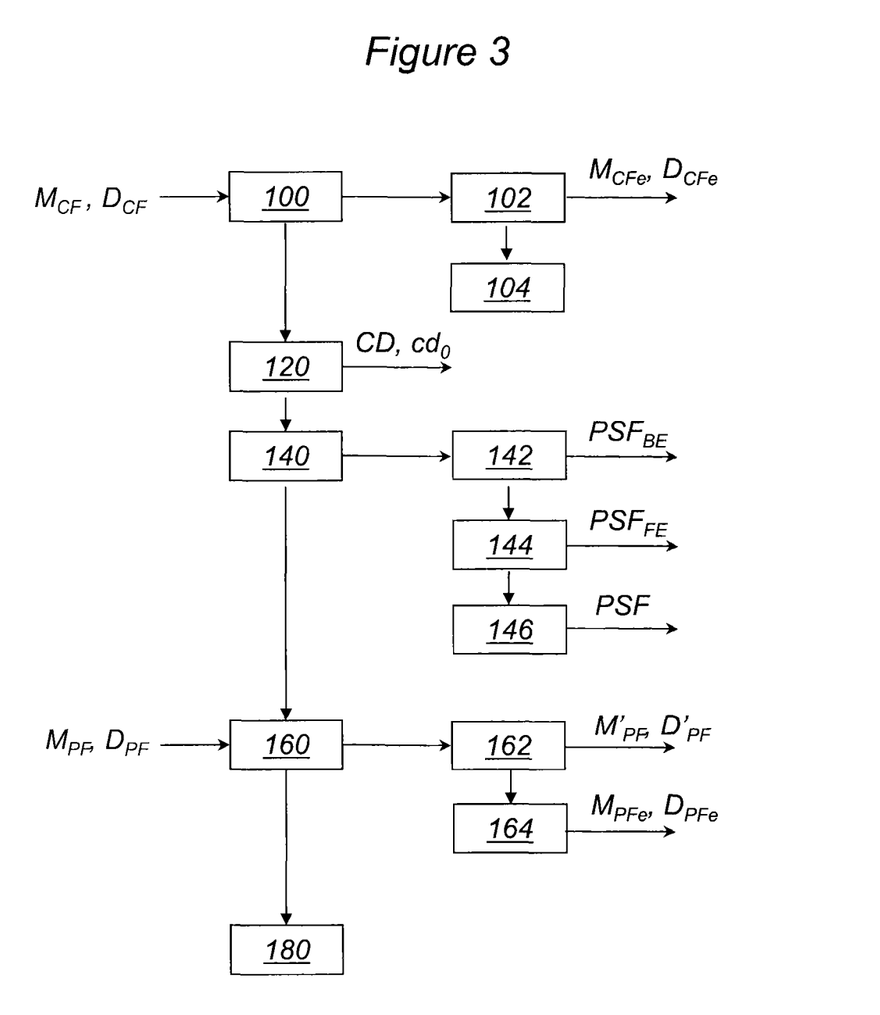
FIG. 3 illustrates the successive steps of an estimation method implemented by the printing device in FIG. 1 using the set of patterns in FIG. 2.

The estimation method illustrated in FIG. 3 and implemented by the printing device 10 in FIG. 1 comprises a first step 100 for printing by means of electron-beam lithography, a set of calibration patterns $M_C$ in a resin arranged on a substrate.

During a first substep 102 of the first step 100, the program 18 for the prior preparation of a set of calibrated patterns $M_C$ to be printed, after previously extracting from the memory the set $M_{CF}$ of geometric shapes and the set $D_{CF}$ of predetermined doses, provides the set of basic geometric shapes $M_{CFe}$ and the set of associated doses $D_{CFe}$. These sets $M_{CFe}$ and $D_{CFe}$ are stored in memory 16.

During a second substep 104 of the first step 100, the electron-beam lithography printing device 14 prints the set of calibration patterns $M_C$ by exposing a resin arranged on a substrate using said sets $M_{CFe}$ and $D_{CFe}$ previously extracted from the memory 16 by this device 14.

During a second step 120, the measuring module 15 provides the characteristic dimensions CD of the central zones 26 of each calibration pattern $M_C[i]$ printed. This module may also help provide the value $cd_0$ corresponding to a characteristic constant of a common dimension of the central zone 26 of each calibration pattern $M_C[i]$ when this central zone 26 is exposed in isolation to the electron beam in the absence of concentric zones $A_C$ with rotational symmetry about this central zone 26.

The constant $cd_0$ may indeed be obtained experimentally, for example by setting the exposure dose of the central zone 26 of any calibration pattern $M_C[i]$ and progressively decreasing the exposure dose $D_{CF}$ of the concentric zones $A_C$ with rotational symmetry of this pattern. Then, a possible solution consists of plotting a curve based on the acquisition of the characteristic dimension CD[i] of the central zone of the calibration pattern $M_C[i]$ in question for each different dose applied to the surrounding concentric zones $A_C$. Finally, the theoretical dimension $cd_0$ corresponding to an exposure dose of the concentric zones $A_C$ equal to zero may be determined by extrapolating said curve, accounting for the zero continuity of the function PSF and the derived function thereof.

During a third step 140, the computer programs 20 and 22 of the processing module 12 are suitable for estimating the point spread function PSF characterising the electrons scattered during printing based on the characteristic dimensions CD measured and the constant $cd_0$.

During a first substep 142 of the third step 140, the computer program 20, after extracting, from the memory 16, the set of dimensions CD={CD[i], 0<i≤n} of the central zone 26 of each of the n calibration patterns $M_C=\{M_C[i], 0<i\leq n\}$ and the constant $cd_0$, provides an estimation of the point spread function $PSF_{BE}$ for characterising the electrons back-scattered by the substrate.

An estimation of the $PSF_{BE}$ giving satisfactory results is calculated by way of example hereinafter.

As a reminder, the point spread function PSF of the scattered electrons is estimated using the equation $PSF=PSF_{FE}+PSF_{BE}$ where $PSF_{BE}$ is a first point spread function portion characterising the electrons back-scattered by the substrate and $PSF_{FE}$ a second point spread function portion characterising the electrons scattered in the resin.

As a general rule, the dose D induced by the calibration patterns exposed at any point P of the surface to be printed results from convoluting the matrix M modelling the set of calibration patterns $M_C$ with the PSF modelling all the electrons scattered by the substrate. In this way, the dose D at any point P is defined according to the following expression:

$$D(P) = \iint_{P' \in \Re^2} (PSF_{FE}(\overrightarrow{PP'}) + PSF_{BE}(\overrightarrow{PP'})) \, M(P') \, dxdy,$$

where the matrix M(P') represents the calibration patterns $M_C$ printed at any point P' of the surface to be printed, equal to 1 for any P' exposed to the electron beam and 0 elsewhere.

According to one preferred embodiment already mentioned above, this matrix M(P') is represented using a Hadamard matrix H wherein the values of the matrix coefficients are corrected to switch from the values 1 and −1 to the values 1 and 0 respectively.

Assuming that the distance of a point P', belonging to the surface of the $i^{th}$ calibration pattern $M_C[i]$, at any point P situated in the vicinity of the central zone 26 of this calibration pattern can be approximated by the distance between this point P' and the centre of the central zone 26 of the calibration pattern $M_C[i]$, and switching from a system of Cartesian coordinates (x,y) to a system of polar coordinates (r, θ), the dose in the vicinity of the $i^{th}$ central zone $D_i(P)$ may be approximated with the following expression:

$$D_i(P) = D_0(P) + \sum_{j=1}^{n} \int_0^{2\pi} \int_{R_{j-1}}^{R_j} \frac{h_{i,j}+1}{2} PSF_{FE}(r, \theta) r dr d\theta +$$
$$\sum_{j=1}^{n} \int_0^{2\pi} \int_{R_{j-1}}^{R_j} \frac{h_{i,j}+1}{2} PSF_{BE}(r, \theta) r dr d\theta,$$

where $D_0(P)$ corresponds to the dose of the central zone 26 of the $i^{th}$ calibration pattern $M_C[i]$ when this central zone 26 is exposed in isolation to the electron beam in the absence of concentric zones $A_C$ with rotational symmetry about this central zone 26 and $h_{i,j}$ represents the coefficients of the Hadamard matrix H and thus the exposure of the $j^{th}$ concentric zone $A_C[j]$ of the $i^{th}$ calibration pattern $M_C[i]$. It should be noted that the expression $$\frac{h_{i,j}+1}{2}$$

is suitable for switching from the value −1 of a coefficient of the Hadamard matrix H to the value 0 of a coefficient of the matrix M.

It should thus be noted that, in the example of an embodiment above, the square matrix M modelling the set of calibration patterns $M_C$ may be expressed using a Hadamard matrix. However, in further embodiments of the invention, a different matrix could be used, this matrix necessarily being an invertible matrix, however.

The dose $D_i(P)$ in the vicinity of the $i^{th}$ central zone obtained accounts for the parasitic dose induced by the concentric zones $A_C$ belonging to the $i^{th}$ pattern and ignores the influence of the remainder of the surrounding patterns. It is thus valid only if the various calibration patterns $M_C[i]$ are at a sufficient distance from each other to be able to ignore the crossed influences thereof.

To simplify the expression, $D_i(P)$, two approximations are then used:
- the support of the function $PSF_{FE}$ being less than the radius $R_C[0]$, of the concentric zone $A_C[1]$ closest to the central zone 26 of a calibration pattern $M_C[i]$, the influence of $PSF_{FE}$ of the concentric zones $A_C$ of this pattern $M_C[i]$ on the central zone 26 thereof may be ignored,
- the value of the function $PSF_{BE}$ is constant on the surface of a concentric zone $A_C[j]$ and the range thereof is dependent on the distance from said concentric to the central zone 26, $\overline{PSF_{BE}}(j)$. For example, $\overline{PSF_{BE}}(j)$ could be equal to the mean value of $PSF_{BE}$ on the concentric zone $A_C[j]$.

When taking into account the above approximations, the dose in the vicinity of the $i^{th}$ central zone $D_i(P)$ may be approximated with the following expression:

$$D_i(P) \simeq D_0(P) + S \sum_{j=1}^{n} \frac{h_{i,j}+1}{2} \overline{PSF_{BE}}(j),$$

where S represents the area of a concentric zone $A_C[j]$ given that all the concentric zones have the same area.

The same expression may be restated in matrix form:

$$D(P) \simeq D_0(P) + S \frac{H+1}{2} \overline{PSF_{BE}}.$$

The dose D(P) in the vicinity of the central zone is thus approximated with the sum of the dose $D_0(P)$ of the central zone 26 exposed in isolation and a constant parasitic dose modulated by the nature of the concentric zones $A_C$ exposed according to the expression:

$$S \frac{H+1}{2} \overline{PSF_{BE}}.$$

One advantage, in that the matrix M modelling the set of calibration patterns $M_C$ can be expressed using a Hadamard matrix H of order n, is that the total value of said parasitic dose varies little between patterns since n/2 concentric zones $A_C$ are always exposed (apart from the first pattern).

Considering that the size of the central zones CD of the calibration patterns varies in a linear fashion with the parasitic dose, it is possible to deduce the expression:

$$CD \propto cd_0 + S \frac{H+1}{2} \overline{PSF_{BE}},$$

where the sign of the proportional factor is dependent on the polarity of the resin used.

The constant factor S of the above expression is a proportional coefficient contributing to the effect of the point spread function $PSF_{BE}$ on the expansion of the characteristic dimensions CD of the central zones 26 according to the following expression:

$$(CD - cd_0) \propto \left(\frac{H+1}{2}\right) \overline{PSF_{BE}}.$$

By multiplying this expression by $$\left(\frac{H+1}{2}\right)^{-1}$$

by each side and applying the properties of Hadamard matrices well-known to those skilled in the art, the following expression for the function $PSF_{BE}$ is obtained:

$$\overline{PSF_{BE}} \propto \left(\frac{H+1}{2}\right)^{-1}(CD-cd_0) = \left(\frac{2}{n}H - \begin{bmatrix} 1 & 0 & \cdots & 0 \\ 0 & 0 & \cdots & 0 \\ \vdots & \vdots & & \vdots \\ 0 & 0 & \cdots & 0 \end{bmatrix}\right)\left(CD - cd_0\begin{bmatrix} 1 \\ \vdots \\ 1 \end{bmatrix}\right)$$

$$\text{where } CD = \begin{bmatrix} CD[1] \\ \vdots \\ CD[n] \end{bmatrix}$$

is the vector including the set {CD[1], . . . , CD[n]} of the characteristic dimensions measured.

Consequently, the estimation of the function $\overline{PSF_{BE}}$ is calculated by inverting the analytical modelling of the effect, on the characteristic dimensions CD, of applying same to the set of calibration patterns $M_C$.

It should be noted that, due to the use of the Hadamard matrix H as the matrix involved in modelling the set of calibration patterns $M_C$, each value of the function $\overline{PSF_{BE}}$ obtained is proportional to a mean of n/2 measurements of characteristic dimensions CD, corresponding to the n/2 concentric zones $A_C$ exposed to the electron beam. In this way, according to the central limit theorem, the function $\overline{PSF_{BE}}$ is a random variable which tends to be normally distributed when n increases. The standard deviation $\sigma_{PSF_{BE}}$ of this random variable $\overline{PSF_{BE}}$ is directly proportional to the standard deviation $\sigma_{CD}$ of the set CD of characteristic dimensions of the calibration patterns $M_C$ and inversely proportional to the root of the number of patterns:

$$\sigma_{PSF_{BE}} \propto \sigma_{CD}\sqrt{\frac{2}{n}}.$$

A sufficiently high number n of calibration patterns $M_C$ would thus ensure the precision of the function $PSF_{BE}$ calculated. Furthermore, this precision is enhanced in relation to another possible embodiment where the influence of each concentric zone would be measured separately without calculating the mean.

During a second substep 144 of the third step 140, the computer program 22, after extracting, from the memory 16, the function $PSF_{BE}$, provides an estimation of the point spread function $PSF_{FE}$ characterising the electrons scattered in the resin, this function $PSF_{FE}$ being determined by means of simulation in a manner known per se of a Gaussian model.

During a third substep 146 of the third step 140, the computer program 22 provides an estimation of the point spread function PSF characterising electrons scattered during printing by calculating the sum of the function $PSF_{BE}$ and the function $PSF_{FE}$.

During a fourth step 160 the computer program 24 of the processing module 12 estimates a pattern (M'$_{PF}$, D'$_{PF}$) to be printed.

During a first substep 162 of this fourth step 160, after extracting, from the memory 16, initial values of a pattern to be printed ($M_{PF}$, $D_{PF}$) and the point spread function PSF, the computer program 24 provides by means of a convolution calculation, an estimation of the pattern (M'$_{PF}$, D'$_{PF}$) to be printed whereon the effects of the parasitic doses induced by the proximity effect have been offset.

During a second substep 164 of the fourth step 160, the computer program 18 (or another similar program), after extracting, from the memory 16, the pattern to be printed (M'$_{PF}$, D'$_{PF}$), provides the set of basic geometric shapes $M_{PFe}$ and the set of associated doses $D_{PFe}$ modelling this pattern and accounting for the parasitic dose induced.

Finally, during a fifth step 180, the printing module 14 prints the pattern (M'$_{PF}$, D'$_{PF}$) on the resin based on the set of basic geometric shapes $M_{PFe}$ and the associated set of doses $D_{PFe}$ having offset the proximity effects and thus with enhanced printing precision.

Obviously, alternative embodiments for estimating the function $PSF_{BE}$ may be envisaged. In this way, the central zone 26 of each calibration pattern $M_C[i]$ may include the first concentric zone $A_C[1]$ with rotational symmetry, said zone being positioned at the centre of the calibration pattern.

In this case and for example, the characteristic dimensions CD of the central zone 26 of each calibration pattern for this alternative embodiment would include the size of the smallest radius $R_C[0]$ of the concentric zone $A_C[1]$ with rotational symmetry positioned at the centre of the calibration pattern provided that it is written on all the calibration patterns. The characteristic constant $cd_0$ would then correspond to the value of $R_C[1]$, common to each calibration pattern $M_C[i]$, when the concentric zone $A_C[1]$ is exposed in isolation to the electron beam in the absence of surrounding concentric zones $A_C=\{A_C[k], 1<k\leq n\}$ with rotational symmetry.

Also alternatively, the concentric zones $A_C=\{A_C[k], 0<k\leq n\}$ with rotational symmetry of the calibration patterns $M_C$ may all have different areas S={S[k], 0<k≤n}. In this case, when calculating the function $PSF_{BE}$, the area S can no longer be considered to a mere proportional coefficient between the function $PSF_{BE}$ and the characteristic dimensions CD of the central zones of the calibration patterns. More specifically, in the expression of the function $PSF_{BE}$, the set {CD[1], CD[2], . . . CD[n]} of the characteristic dimensions measured should be weighted with the set {S[1], S[2], . . . S[n]} of the respective areas of the concentric zones $A_C=(A_C[k], 0<k\leq n)$ with rotational symmetry. The function $PSF_{BE}$ is, in this case, defined by the following expression:

$$PSF_{BE} \propto \left(\frac{2}{n}H - \begin{bmatrix} 1 & 0 & \cdots & 0 \\ 0 & 0 & \cdots & 0 \\ \vdots & \vdots & & \vdots \\ 0 & 0 & \cdots & 0 \end{bmatrix}\right)\left(\begin{bmatrix} \frac{CD[1]}{S[1]} \\ \vdots \\ \frac{CD[n]}{S[n]} \end{bmatrix} - cd_0\begin{bmatrix} 1 \\ \vdots \\ 1 \end{bmatrix}\right).$$

It is clear that a printing device and a method for estimating patterns to be printed such as those described above are suitable for printing a pattern on a plate or mask by means of electron-beam lithography with an enhanced precision and satisfactory offset of the proximity effects. By providing a model for estimating the function PSF of the back-scattered electrons without making assumptions on the general shape of the function PSF (other than the rotational symmetry thereof), the estimation of the resulting patterns to be printed is sufficiently precise and the performances of the printing device are enhanced.

Furthermore, it should be noted that the invention is not limited to the embodiments described above. Indeed, it would be obvious to those skilled in the art that various modifications may be made to the embodiments described above, in the light of the teaching disclosed herein. In the following claims, the terms used should not be interpreted as limiting the claims to the embodiments disclosed in the present description, but should be interpreted to include any equivalents intended to be covered by the claims due to the wording thereof and which can be envisaged by those skilled in the art by applying their general knowledge to implementing the teaching disclosed herein.

The invention claimed is:

1. A method for estimating patterns to be printed on a plate or mask by electron-beam lithography, comprising the following steps:

printing with electron-beam lithography, in a resin arranged on a substrate, a set of calibration patterns measuring characteristic dimensions of the set of calibration patterns after printing, and saving said characteristic dimensions to memory, executing a program on a processing module, having access to the memory, to supply an estimation of the point spread function characterising electrons scattered during printing, based on the characteristic dimensions measured, estimating the patterns to be printed by convoluting the point spread function supplied with an initial value of these said patterns to be printed, wherein:

each calibration pattern printed in the resin includes a central zone exposed to the electron beam and a plurality of concentric zones with rotational symmetry arranged about this central zone, the characteristic dimensions measured after printing are characteristic dimensions of the central zones of the patterns, and the executing a program on a processing module comprises estimating the point spread function by calculating the sum of a first point spread function portion characterising electrons back-scattered by the substrate and a second point spread function portion characterising electrons scattered in the resin, and performing an inversion of analytical modelling of the effect, on said characteristic dimensions, of applying the first point spread function portion to the set of calibration patterns.

2. The method for estimating patterns to be printed as claimed in claim 1, wherein the executing a program on a processing module comprises application of the first point spread function portion to the set of calibration patterns is by modelling analytically by the product of a matrix modelling the set of calibration patterns with a vector modelling the first point spread function portion, the analytical modelling being inverted by inverting the matrix modelling the set of calibration patterns.

3. The method for estimating patterns to be printed as claimed in claim 2, wherein the executing a program on a processing module comprises matrix modelling the set of calibration patterns using a square matrix of order n that models a set of n patterns with n concentric zones, each row of the matrix corresponding to one of the calibration patterns and each column of the matrix corresponding to one of these concentric zones.

4. The method for estimating patterns to be printed as claimed in claim 3, wherein the executing a program on a processing module comprises matrix modelling the set of calibration patterns using a Hadamard matrix.

5. The method for estimating patterns to be printed as claimed in claim 4, wherein executing a program on a processing module comprises defining the first point spread function portion characterising the electrons back-scattered by the substrate, annotated $PSF_{BE}$, by the following expression:

$$PSF_{BE} \propto \left( \frac{2}{n} H - \begin{bmatrix} 1 & 0 & \cdots & 0 \\ 0 & 0 & \cdots & 0 \\ \vdots & \vdots & & \vdots \\ 0 & 0 & \cdots & 0 \end{bmatrix} \right) \left( \begin{bmatrix} \frac{CD[1]}{S[1]} \\ \vdots \\ \frac{CD[n]}{S[n]} \end{bmatrix} - cd_0 \begin{bmatrix} 1 \\ \vdots \\ 1 \end{bmatrix} \right),$$

where the symbol $\propto$ denotes a proportional relationship, H is the Hadamard matrix based on which the set of calibration patterns $(M_{CF}, D_{CF})$ is modelled, $$\begin{bmatrix} \frac{CD[1]}{S[1]} \\ \vdots \\ \frac{CD[n]}{S[n]} \end{bmatrix}$$

is a vector including the set $\{CD[1], \ldots, CD[n]\}$ of the characteristic dimensions measured, weighted by the set $\{S[1], \ldots S[n]\}$ of the respective areas of the concentric zones with rotational symmetry, and $cd_0$, is a characteristic constant of a common dimension of the central zone of each calibration pattern when said central zone is exposed in isolation to the electron beam in the absence of concentric zones with rotational symmetry about said central zone.

6. The method for estimating patterns to be printed as claimed in claim 1, wherein the executing a program on a processing module comprises modelling the second point spread function portion using a Gaussian function, the parameters of this Gaussian function being determined by simulation on a plurality of calibration patterns.

7. The method for estimating patterns to be printed as claimed in claim 1, wherein the concentric zones with rotational symmetry of the calibration patterns all have the same area.

8. The method for estimating patterns to be printed as claimed in claim 5, wherein the executing a program on a processing module comprises defining the first point spread function portion characterising the electrons back-scattered by the substrate by the following expression:

$$PSF_{BE} \propto \left( \frac{2}{n} H - \begin{bmatrix} 1 & 0 & \cdots & 0 \\ 0 & 0 & \cdots & 0 \\ \vdots & \vdots & & \vdots \\ 0 & 0 & \cdots & 0 \end{bmatrix} \right) \left( \begin{bmatrix} CD[1] \\ \vdots \\ CD[n] \end{bmatrix} - cd_0 \begin{bmatrix} 1 \\ \vdots \\ 1 \end{bmatrix} \right).$$

9. The method for estimating patterns to be printed as claimed in claim 1, wherein the central zone of each calibration pattern includes one of the concentric zones with rotational symmetry, positioned at the centre of said pattern.

10. A device for printing patterns on a plate or mask by means of electron-beam lithography, comprising:

means for printing using electron-beam lithography, in a resin arranged on a substrate, a set of calibration patterns means for measuring characteristic dimensions of the set of calibration patterns after printing and means for storing these characteristic dimensions in memory, a processor having access to the memory and programmed to supply an estimation of the point spread function characterising electrons scattered during printing, based on the characteristic dimensions measured, means for estimating the patterns to be printed by convoluting the point spread function supplied with an initial value of these patterns to be printed, wherein, each calibration pattern to be printed in the resin comprises a central zone exposed to the electron beam and a plurality of concentric zones with rotational symmetry arranged about this central zone, the measuring means are means for measuring the characteristic dimensions of the central zones of the patterns after printing, and the processor is programmed to calculate the estimation of the point spread function as the sum of a first point spread function portion characterising electrons backscattered by the substrate and a second point spread function portion characterising electrons scattered in the resin, and by inverting analytical modelling of the effect, on said characteristic dimensions, of applying the first point spread function portion to the set of calibration patterns.

* * * * *